United States Patent [19]

Staley

[11] Patent Number: 4,805,731

[45] Date of Patent: Feb. 21, 1989

[54] SOUND PROJECTION METHOD AND APPARATUS

[75] Inventor: Wayne L. Staley, Frankfort, Ind.

[73] Assignee: Audionics, Inc., Frankfort, Ind.

[21] Appl. No.: 176,040

[22] Filed: Mar. 31, 1988

[51] Int. Cl.[4] .................... H05K 5/00

[52] U.S. Cl. .................... 181/175; 181/145; 181/155; 181/30; 381/160

[58] Field of Search .................... 181/30, 144–148, 181/150, 155, 175; 381/160

[56] References Cited

U.S. PATENT DOCUMENTS

| | | | |
|---|---|---|---|
| 1,683,879 | 9/1928 | Ewald | 181/192 |
| 2,544,742 | 3/1951 | Volf | 181/145 |
| 2,896,736 | 7/1959 | Karlson | 181/30 |
| 2,955,669 | 10/1960 | Rice | 181/199 |
| 3,912,866 | 10/1975 | Fox | 181/155 X |
| 3,964,571 | 6/1976 | Snell | 181/150 |
| 4,280,586 | 7/1981 | Petersen | 181/150 |
| 4,356,880 | 11/1982 | Downs | 181/30 |
| 4,473,721 | 9/1984 | Klein | 181/144 X |

OTHER PUBLICATIONS

Syn-Aud-Con Newsletter, vol. 13, No. 1, 1985, p. 19.

*Primary Examiner*—B. R. Fuller
*Attorney, Agent, or Firm*—Jack Schuman

[57] ABSTRACT

An acoustical reflector is positioned in such manner relative to a loudspeaker as to reflect all of the indirect sound waves generated as a necessary concomitant to the generation of direct sound waves by the loudspeaker substantially only to the audience area receiving said direct sound waves from the loudspeaker. In an array of a plurality of loudspeaker, each serving one of a plurality of audience areas, acoustical reflectors are positioned relative to said plurality of loudspeakers so that indirect sound waves, generated as a result of the generation of direct sound waves by each of said loudspeakers, are reflected substantially only to the audience area served by said loudspeaker and not to audience areas served by other loudspeakers.

2 Claims, 1 Drawing Sheet

SOUND PROJECTION METHOD AND APPARATUS

BACKGROUND OF THE INVENTION (1) Field of the Invention

This invention relates broadly to method and apparatus for providing a selected audience area with undistorted or intelligible sound.

More specifically, this invention relates to method and apparatus for providing each of a plurality of selected audience areas with undistorted or intelligible sound from one of a plurality of sound generating sources.

Even more specifically, this invention relates to method and apparatus for providing each of a plurality of selected audience areas, such as various locations in enclosed or unenclosed spaces, with undistorted or intelligible sound from one of a plurality of sound generating sources, such as multiple acoustical sources or loudspeakers mounted in close proximity to each other in a public address system, whereby the effects of intermodulation and other forms of interactive distortion among said plurality of sound generating sources are reduced.

(2) Description of the Prior Art

Various types of sound generating sources embodying acoustical speaker systems are known.

U.S. Pat. No. 2,955,669 (1960) to Rice discloses a triplanar hanging speaker enclosure utilizing two walls and a ceiling as sound baffles, wherein, it is said, the enclosure requires an absolute minimum of space and is highly efficient in speaker-to-air coupling. Rice neither discloses nor suggests reflecting indirect sound waves, generated as a necessary concomitant to the generation of direct sound waves, only to the audience area served by the speaker. More particularly, Rice neither discloses nor suggests the speaker enclosure serving each of a plurality of separate audience areas by means of one of a plurality of speakers, wherein indirect sound waves generated at one speaker are reflected only to the audience area served by the said one speaker and not the audience areas served by the other speakers. Rice does not teach how to reduce or eliminate the effects of intermodulation and other forms of interactive distortion among a plurality of speakers.

U.S. Pat. No. 2,544,742 (1951) to Volf discloses a loudspeaker unit containing a multiplicity of loud speakers directed in four or five different directions for use in an auditorium. It is said that this unit provides speeches or music clearly and without objectionable echoes. The unit is described as being exactly cubical and having four loud speakers mounted therein and facing in four directions 90° apart, so that the sound is projected in all directions, and a fifth loud speaker centrally mounted in the bottom of the cabinet and facing downwardly. The cabinet is divided by partition into four compartments, one for each of the four radially mounted loudspeakers. Volf neither discloses nor suggests reflecting indirect sound, generated at one speaker as a necessary concomitant to the generation of direct sound by the said speaker, only to the audience area served by the said speaker. More particularly, Volf neither discloses nor suggests a speaker enclosure serving a plurality of separate audience areas by means of a plurality of speakers whereby indirect sound waves generated by one of the plurality of speakers is reflected only to the audience area served by the said one speaker and not to the audience areas served by the other speakers. Volf does not teach how to reduce or eliminate the effects of intermodulation and other forms of interactive distortion among a plurality of speakers. Quite to the contrary, Volf specifically teaches that the direct sound waves emanating from the five loudspeakers blend and coalesce in mid-air, at a distance equal to about twice the length of one edge of the cubical cabinet whereby, it is said, the smoothness and fidelity of the resonated sound waves are increased. Actually, the indirect sound waves in Volf's system generated at the speakers must also blend and coalesce, which is exactly contrary to the intent of the present invention.

The terms "direct sound" and "indirect sound," as used throughout the present specification and claims, can be most easily understood by considering a sound generating source or means in its most conventional form, viz. a loudspeaker having a conical diaphragm aimed at an audience area intended to be served by the loudspeaker.

As electrical currents in the coil of the loudspeaker fluctuate according to the electrical signals fed into the coil analogous to the frequencies of sound intended to be generated by the loudspeaker, the diaphragm will move at the desired frequency, causing positive and negative fluctuations in air pressure in front of it, which results in the generation of sound waves projected or directed toward the audience area. These sound waves are termed "direct sound" or "direct sound waves." The space in front of the diaphragm in which these positive and negative fluctuations in air pressure are generaated by the diaphragm may be termed the pressure zone of the diaphragm. The atmosphere adjacent this pressure zone reacts to the fluctuations of air pressure in the pressure zone with a finite delay to balance such positive and negative fluctuations, thus tending to restore the space around the diaphragm, including the pressure zone, to equilibrium which is ambient atmospheric pressure. This reaction of the atmosphere adjacent the pressure zone is a necessary concomitant to the generation of direct sound waves by the diaphragm and results in the generation of other sound waves which are termed "indirect sound" or "indirect sound waves" which are projected in a direction or directions generally away from the audience area.

If not reflected in the manner hereinafter described, such indirect sound waves could cause reverberation which, when reaching the audience area served by the loudspeaker, could so distort the direct sound waves projected to the audience area served by the loudspeaker as to render them unintelligible. It is these indirect sound waves which, when reaching audience areas served by other loudspeakers in a multi-speaker system, could result in intermodulation and other forms of interactive distortion of the direct sound waves generated by the other loudspeakers to such an extent as to render those direct sound waves unintelligible.

U.S. Pat. No. 3,964,571 (1976) to Snell discloses a loudspeaker system having acoustical reflector surfaces which minimize those reflections from an acoustic boundary which are out of phase with direct sound generated by a loudspeaker. Snell neither discloses nor suggests positioning an acoustical reflector relative to the loudspeaker in such manner that indirect sound is reflected only to the audience area served by the loudspeaker. Snell also discloses a multispeaker arrangement with acoustical boundaries as reflectors and with an acoustical absorber to minimize certain reflections which may sometimes be out of phase with direct sound, but does not teach reflecting indirect sound generated adjacent one loudspeaker only to the audience area served by the said loudspeaker and not to audience areas served by adjacent loudspeakers.

In addition to the sound generating systems disclosed in the prior art patents hereinbefore described in some detail, various other types of acoustical speaker systems are known. These are, for example, the systems illustrated in U.S. Pat. No. 3,912,866 (1975) to Fox, U.S. Pat. No. 4,280,586 (1981) to Petersen, and U.S. Pat. No. 4,473,721 (1984) to Klein. These are intended as an illustrative listing of U.S. prior art patents and not as an exhaustive listing of all prior art patents relating to acoustical speaker systems.

SUMMARY OF THE INVENTION

One of the objects of this invention is to provide method and apparatus permitting an audience area served by a loudspeaker to receive intelligible sound from the loudspeaker.

Another of the objects of this invention is to provide method and apparatus to eliminate or substantially reduce reverberation reaching an audience area served by a loudspeaker.

Yet another object of this invention is to provide method and apparatus to eliminate or substantially reduce intermodulation and other forms of interactive distortion of direct sound waves reaching a plurality of audience areas, each served by one of a plurality of sound generating souces, which intermodulation and other forms of interactive distortion might otherwise be caused by indirect sound waves generated adjacent one of said sound generating sources as a necessary concomitant to the generation of said direct sound waves reaching audience areas served by other sound generating sources, thereby to assure that each of said audience areas receives intelligible sound from one of said sound generating sources.

Other and further objects of this invention will become apparent by reference to the accompanying specification and drawings, and to the appended claims.

Briefly, I have discovered that the foregoing objects may be attained by providing an acoustical reflector positioned in such manner relative to a loudspeaker as to reflect all of the indirect sound waves generated as a necessary concomitant to the generation of direct sound waves by the loudspeaker substantially only to the audience area receiving said direct sound waves from the said loudspeaker, and in the case of an array of a plurality of loudspeakers each serving one of a plurality of audience areas, by positioning acoustical reflectors relative to said plurality of loudspeakers so that indirect sound waves, generated as a result of the generation of direct sound waves by each of said loudspeakers, are reflected substantially only to the audience area served by said loudspeaker and not to audience areas served by other loudspeakers.

DESCRIPTION OF THE PREFERRED EMBODIMENTS

Figure 1:
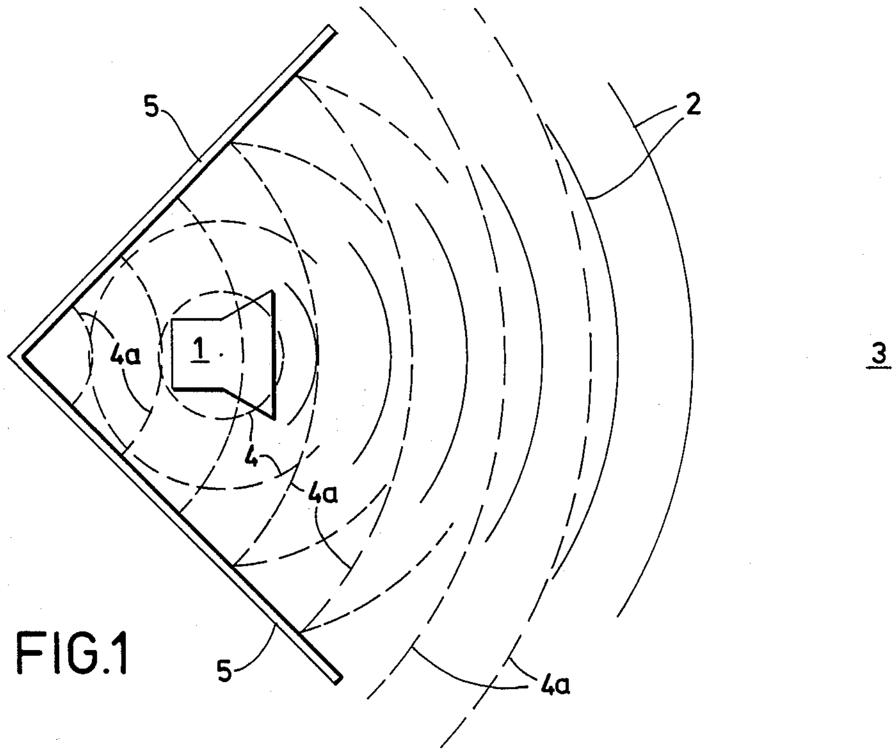
FIG. 1 represents a diagrammatic view in plan of a sound generating source, direct sound waves shown in solid lines generated by the sound generating source being projected or directed to the audience area served by the sound generating source, indirect sound waves shown in dashed lines generated adjacent the sound generating source directed generally away from the audience area, and acoustical reflecting means so positioned relative to the sound generating source as to reflect the indirect sound waves substantially only to the audience area served by the sound generating source.

FIG. 1 shows loudspeaker 1 constituting a sound generating source or means projecting direct sound waves 2 (shown in solid lines) towards audience area 3. As a necessary concomitant to the generation of said direct sound waves 2, indirect sound waves 4 (shown in dashed lines) are generated adjacent loudspeaker 1 in directions generally away from audience area 3. Acoustical reflectors or boundaries 5 are positioned relative to loudspeaker 1 in such manner that indirect sound waves 4 impinging upon acoustical reflectors 5 are reflected as waves **4*a* (also shown in dashed lines) substantially only to the audience area 3**.

The exact dispositions of acoustical reflectors 5 relative to loudspeaker 1 are determined by means of conventional audiometric equipment located in the audience area 3 measuring characteristics of the direct sound waves 2 and reflected indirect sound waves **4*a* reaching the audience area 3. When the audience area 3 receives intelligible sound waves from loudspeaker 1, the acoustical reflectors 5 have been properly positioned relative to loudspeaker 1**.

Acoustical reflectors 5 must be good reflectors of sound and must have sufficient mass and stiffness so that, when indirect sound waves 4 impinge upon the surface of acoustical reflectors 5, the said acoustical reflectors 5 do not constitute yet another source of sound waves. In an exemplary embodiment, acoustical reflectors 5 may be constructed of particle board covered with fiberglass material. Of course, other methods and materials for constructing acoustical reflectors 5 may be employed, and yet be within the scope of my invention. Acoustical reflectors 5 are shown in FIG. 1 as being planar. However, it should be understood that they may be curved in various shapes.

If loudspeaker 1 is positioned in front of, or adjacent to, certain types of structures (not shown in FIG. 1) indirect sound waves 4 generated adjacent loudspeaker 1 may, on impinging upon said structures, cause reverberation which, if severe enough, can render unintelligible direct sound waves 2 in the audience area 3. The proper positioning of acoustical reflectors 5 will prevent indirect sound waves 4 from impinging upon said structures, thereby eliminating this undesirable reverberation.

Figure 2:
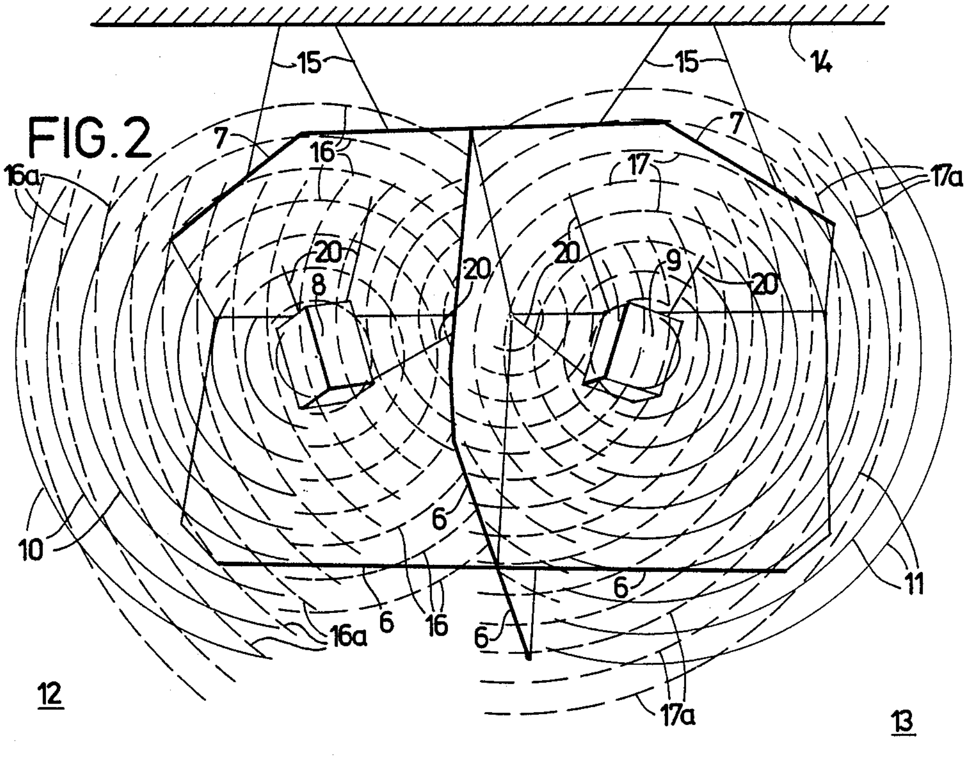
FIG. 2 represents a diagrammatic view in perspective of a cluster or array of loudspeakers serving four audience areas, showing direct sound waves in solid lines and showing acoustical reflectors or boundaries so positioned relative to the loudspeakers as to reflect indirect sound waves shown in dashed lines generated adjacent each loudspeaker of the array substantially only to its respective audience area.

FIG. 2 is intended to show a cluster or array of four loudspeakers or speaker systems, each serving only one of four audience areas in an enclosed space (such as an auditorium) or in an unenclosed space (such as an outdoor amphitheater). These four speaker systems are separated from each other by acoustical reflectors or boundaries 6, and are backed rearwardly by acoustical reflectors or boundaries 7, the said acoustical reflectors or boundaries 6 and 7 being secured to each other edgewise in any suitable manner. Because acoustical reflectors 6 lie in front of two of the four speaker systems, only two speaker systems 8 and 9 are shown in FIG. 2, suspended from acoustical reflectors 6 and 7 by means of cables 20, and projecting direct sound waves 10 and 11 (shown in solid lines), respectively, substantially only to their respective audience areas 12 and 13. It will be understood that two similar speaker systems lie behind the plane of that acoustical reflector 6 parallel to the plane of FIG. 2, and that each of the two speaker systems similarly project direct sound waves toward their respective audience areas. The assembly of acoustical reflectors 6 and 7 may be supported from suitable structures such as an overhead ceiling or beam 14 by means of various struts 15 (only four of which are shown) secured to acoustical reflectors 6 and 7 and to ceiling or beam 14 generally as shown.

Speaker systems 8 and 9, and those not shown in FIG. 2, are selected for proper energy and frequency characteristics so as to be capable of handling the distances to and the angles of their respective audience areas 12, 13, etc. As a necessary concomitant to the generation of direct sound waves 10 and 11, indirect sound waves 16 and 17 (shown in dashed lines) are generated adjacent speaker systems 8 and 9 in directions generally away from audience areas 12 and 13.

Acoustical reflectors 6 and 7 have the same physical properties as those of acoustical reflector 5 of FIG. 1, viz. they must be good reflectors of sound and must have sufficient mass and stiffness so that, when indirect sound waves 16 and 17 impinge upon the surfaces of acoustic reflectors 6 and 7, the said acoustical reflectors 6 and 7 do not constitute yet another source of sound waves. Acoustical reflectors 6 and 7 may be constructed of particle board covered with fiberglass material, although methods and materials of construction may be employed and still be within the scope of my invention. Acoustical reflectors 6 and 7 are shown in FIG. 2 as being planar, although they may also be curved in various shapes.

Acoustical reflectors 6 and 7 are positioned between and adjacent systems 8 and 9, and those not shown in FIG. 2, in such manner that indirect sound waves 16 or 17 generated adjacent one particular speaker system impinge upon the said acoustical reflectors 6 and 7 and are reflected respectively as waves **16*a* or 17*a*** (shown on dashed lines) substantially only to the audience area served by the said one particular speaker system.

In this manner, indirect sound waves generated adjacent one speaker system do not penetrate the areas of direct sound waves generated by other speaker systems, and specifically do not reach the audience areas served by other speaker systems. Thus, indirect sound waves of one speaker system will not modulate direct sound waves of other speaker systems or otherwise cause interactive distortion of direct sound waves of other speaker systems. The result of this arrangement is that each audience area of a plurality of adjacent audience areas will receive intelligible direct sound waves from one of a plurality of adjacent speaker systems.

The exact dispositions of acoustical reflectors 6 and 7 relative to speaker systems 8, 9, etc. are determined by means of conventional audiometric equipment located in the several audience areas 12, 13, etc. measuring characteristics of the direct sound waves 10, 11, etc. and of the reflected indirect sound waves **16*a* and 17*a* reaching the said audience areas. When each audience area 12, 13, etc. receives intelligible sound waves from speaker systems 8, 9, etc., the acoustical reflectors or boundaries 6 and 7 have been properly positioned relative to speaker systems 8, 9**, etc.

The foregoing is considered as illustrative only of the principles of the invention. Further, since numerous modifications and changes will readily occur to those skilled in the art to which this invention pertains, it is not desired to limit the invention to the exact method and apparatus shown and described therein, and accordingly all suitable modifications and equivalents may be resorted to falling within the scope of the invention.

I claim:

1. Method of providing a plurality of selected audience areas with intelligible sound waves from a plurality of sources of sound waves, said method comprising:

(a) generating from a plurality of sound generating sources, each of said sound generating sources being associated with one only of said plurality of selected audience areas, a plurality of direct sound waves, each of said plurality of direct sound waves being directed towards the selected audience area associated with a particular sound generating source, said step of generating each of said plurality of direct sound waves unavoidably generating indirect sound waves in a direction generally away from the selected audience area associated with the said direct sound wave, (b) simultaneously reflecting each of said indirect sound waves generated at one of said sound generating sources substantially only to the selected audience area associated with said one sound generating source, thereby preventing indirect sound waves generated by each of said sound generating sources from being directed to selected audience areas associated with other sound generating sources, (c) whereby each selected audience area receives intelligible sound waves only from said respective sound generating source.

2. Apparatus for providing a plurality of selected audience areas with intelligible sound waves, said apparatus comprising:

(a) a plurality of sound generating means, one for each of said plurality of selected audience areas, each of said sound generating means being adapted to generate direct sound waves in a direction toward said respective selected audience area, each of said sound generating means as a necessary concomitant to the generation of said direct sound waves also generating indirect sound waves in a direction generally away from said respective selected audience area, (b) acoustical reflecting means positioned relative to and between adjacent sound generating means in such manner as to reflect indirect sound waves generated by each of said plurality of sound generating means substantially only to the selected audience area associated with said sound generating means thereby preventing indirect sound waves generated by each of said sound generating means from being directed to selected audience areas associated with other sound generating means, (c) whereby each selected audience area receives intelligible sound waves only from said respective sound generating means.

* * * * *